United States Patent
Ju (10) Patent No.: US 7,411,858 B2
(45) Date of Patent: Aug. 12, 2008

(54) DUAL-PLANE TYPE FLASH MEMORY DEVICE HAVING RANDOM PROGRAM FUNCTION AND PROGRAM OPERATION METHOD THEREOF

(75) Inventor: Gi Seok Ju, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 204 days.

(21) Appl. No.: 11/485,463

(22) Filed: Jul. 13, 2006

(65) Prior Publication Data

US 2007/0242552 A1    Oct. 18, 2007

(30) Foreign Application Priority Data

Mar. 31, 2006   (KR) .................... 10-2006-0029635

(51) Int. Cl.
*G11C 8/00* (2006.01)
(52) U.S. Cl. ..................... 365/230.03; 365/230.06; 365/230.08; 365/230.04; 365/189.04
(58) Field of Classification Search ............ 365/230.03, 365/230.06, 230.08, 230.04, 189.04
See application file for complete search history.

(56) References Cited

U.S. PATENT DOCUMENTS

| | | | |
|---|---|---|---|
| 6,111,792 A * | 8/2000 | Oku et al. .............. | 365/185.33 |
| 6,940,759 B2 | 9/2005 | Tsang et al. | |
| 6,956,769 B2 * | 10/2005 | Lee ...................... | 365/185.09 |
| 7,259,989 B2 * | 8/2007 | Toyama et al. ......... | 365/185.12 |
| 2002/0012270 A1 * | 1/2002 | Taura et al. ............ | 365/185.09 |
| 2005/0099857 A1 | 5/2005 | Yuan et al. | |

FOREIGN PATENT DOCUMENTS

| | | |
|---|---|---|
| JP | 2003-109380 | 4/2003 |
| KR | 1020030054907 | 7/2003 |
| KR | 1020050106582 | 11/2005 |

* cited by examiner

*Primary Examiner*—Tuan T. Nguyen
(74) *Attorney, Agent, or Firm*—Lowe Hauptman Ham & Berner LLP (57) ABSTRACT

A dual-plane type flash memory device having a random program function and program operation method thereof. The flash memory device includes a first plane, a second plane, a first X-decoder, and a second X-decoder. The first plane includes first memory blocks sequentially arranged in a row direction. The second plane includes second memory blocks sequentially arranged in a row direction. The first X-decoder activates one of the first memory blocks in response to a first block address signal. The second X-decoder activates one of the second memory blocks in response to a second block address signal. The block activated by the first X-decoder of the first memory block is different from the block activated by the second X-decoder of the second memory blocks. Accordingly, during a program operation, memory blocks of two planes having different block addresses can be selected and programmed. Accordingly, the operational performance of the flash memory device can be enhanced.

22 Claims, 4 Drawing Sheets

DUAL-PLANE TYPE FLASH MEMORY DEVICE HAVING RANDOM PROGRAM FUNCTION AND PROGRAM OPERATION METHOD THEREOF

BACKGROUND

1. Field of the Invention

The present invention generally relates to a flash memory device, and more particularly, to a dual-plane type flash memory device having a random program function and program operation method thereof.

2. Discussion of Related Art

Recently, as the demand for semiconductor memory devices with a large memory capacity increases, various kinds of semiconductor memory devices with an increased storage capacity have been developed. A flash memory device of the semiconductor memory devices is designed in a multi-plane type in order to increase its memory capacity. The multi-plane type flash memory device includes a plurality of planes. Each of the plurality of planes includes a plurality of memory blocks.

Figure 1:
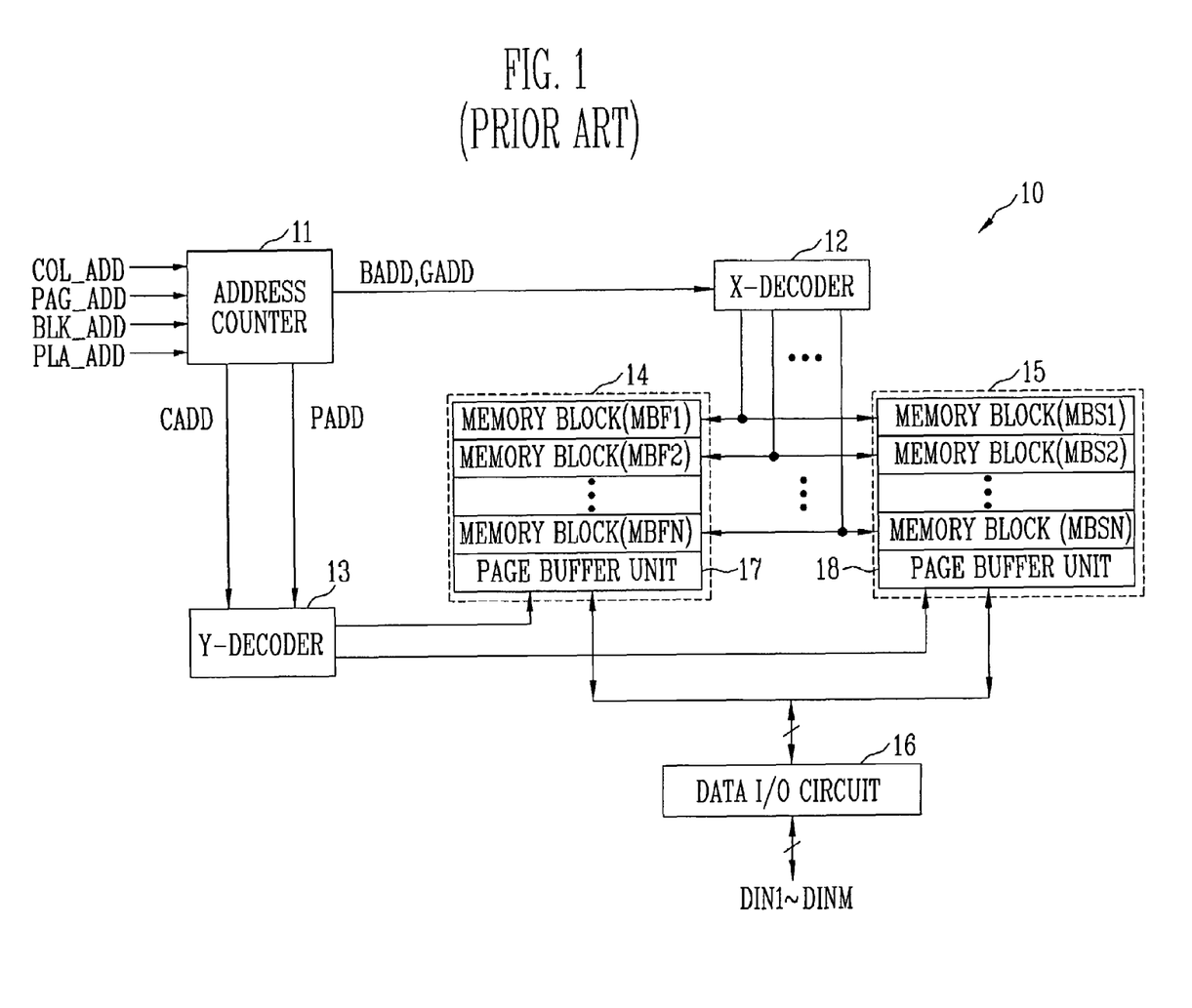
FIG. 1 is a schematic block diagram of a dual-plane type flash memory device in the related art.

FIG. 1 is a schematic block diagram of a dual-plane type flash memory device in the related art. Referring to FIG. 1, a flash memory device 10 includes an address counter 11, a X-decoder 12, a Y-decoder 13, planes 14, 15, and a data I/O circuit 16.

The planes 14, 15 include memory blocks MBF1 to MBFN, MBS1 to MBSN (N is an integer) and page buffer units 17, 18, respectively. The address counter 11 receives a plane address signal PLA_ADD, a column address signal COL_ADD, a block address signal BLK_ADD, and a page address signal PAG_ADD and outputs an internal plane address signal PADD, an internal column address signal CADD, an internal block address signal BADD, and an internal page address signal GADD.

The Y-decoder 13 selects one of the page buffer units 17, 18 in response to the internal plane address signal PADD and the internal column address signal CADD. The reason why the Y-decoder 13 selects one of the page buffer units 17, 18 is that the page buffer units 17, 18 share the data I/O circuit 16. Accordingly, the data input or output operations of the page buffer units 17, 18 are not executed at the same time, but are sequentially executed one by one.

The X-decoder 12 selects one of the memory blocks MBF1 to MBFN or MBS1 to MBSN of each of the planes 14, 15 in response to the internal block address signal BADD. At this time, the X-decoder 12 selects memory blocks of the planes 14, 15 having the same block address at the same time. For example, when the first memory block MBF1 of the plane 14 is selected, the first memory block MBS1 of the plane 15 is selected. As described above, in the flash memory device 10, the X-decoder 12 can select only memory blocks of the planes 14, 15 (for example, MBF1, MBS1) having the same block address.

In other words, the X-decoder 12 cannot select memory blocks of the planes 14, 15 having different block addresses. Accordingly, during a program operation of the flash memory device 10, the memory blocks MBF1, MBS1 of the planes 14, 15 having the same block address are programmed. The program operation of the flash memory device 10 may serve to limit the operational performance of the flash memory device 10.

SUMMARY OF THE INVENTION

An embodiment of the present invention is that it provides a dual-plane type flash memory device having a random program function, in which memory blocks having different block addresses, of two planes are selected and programmed during the program operation, thereby enhancing the operational performance.

Another embodiment of the present invention is that it provides a program operation method of a dual-plane type flash memory device having a random program function, in which memory blocks of two planes having different block addresses, are selected and programmed during the program operation, thereby enhancing the operational performance.

According to an aspect of the present invention, there is provided a flash memory device includes a first plane, a second plane, a first X-decoder, and a second X-decoder. The first plane includes first memory blocks sequentially arranged in a row direction. The second plane includes second memory blocks sequentially arranged in a row direction. The first X-decoder activates one of the first memory blocks in response to a first block address signal. The second X-decoder activates one of the second memory blocks in response to a second block address signal. The block address activated by the first X-decoder of the first memory blocks is different from the block address activated by the second X-decoder of the second memory blocks.

According to another aspect of the present invention, there is provided a program operation method of a flash memory device, including the steps of storing first input data in a first page buffer unit included in a first plane, activating one of first memory blocks included in the first plane and sequentially arranged in a row direction, storing second input data in a second page buffer unit included in a second plane, activating one of second memory blocks included in the second plane and sequentially arranged in a row direction, and when one of the first memory blocks and one of the second memory blocks are activated, transmitting the first and second input data included in the first and second page buffer units to the activated first and second memory blocks. A block address of the activated first memory block is different from that the activated second memory block.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 2:
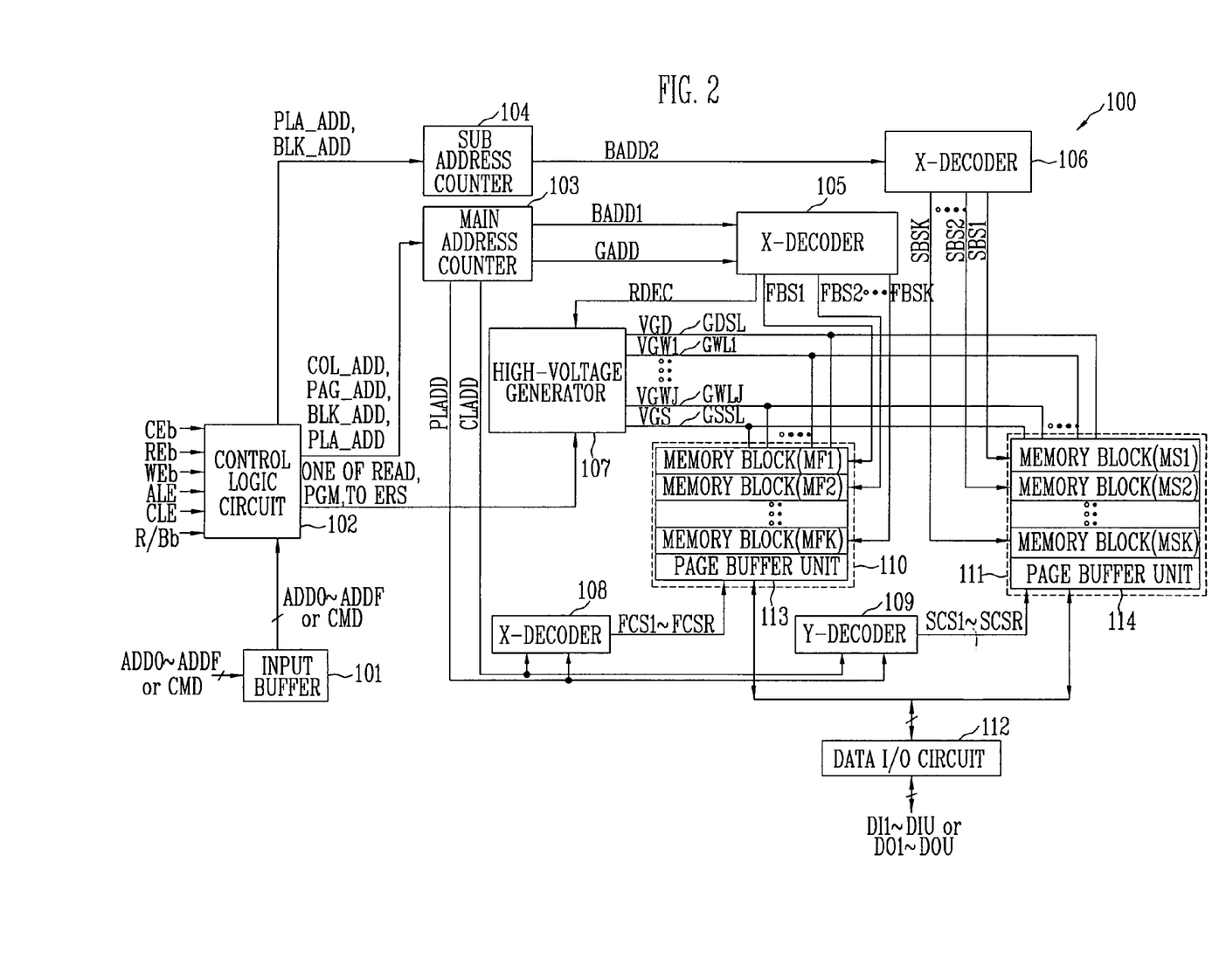
FIG. 2 is a schematic block diagram of a dual-plane type flash memory device according to an embodiment of the present invention.

FIG. 2 is a schematic block diagram of a dual-plane type flash memory device according to an embodiment of the present invention.

Referring to FIG. 2, a flash memory device 100 includes an input buffer 101, a control logic circuit 102, a main address counter 103, a sub address counter 104, X-decoders 105, 106, a high-voltage generator 107, Y-decoders 108, 109, and planes 110, 111.

The input buffer 101 receives a command signal CMD or an external address signals ADD0 to ADDF (F is an integer) and outputs them to the control logic circuit 102.

The control logic circuit 102 generates one of a read command READ, a program command PGM, and an erase command ERS in response to the command signal CMD. Preferably, the control logic circuit 102 may receive the command signal CMD including a page program set-up code (for example, 80h) and then generate the program command PGM when receiving the command signal CMD including a page program set-up code (for example, 81h). Furthermore, the control logic circuit 102 disables a ready/busy bar signal R/Bb during a set time in response to the command signal CMD. In more detail, when the command signal CMD includes a confirmation code (for example, 11h), the control logic circuit 102 disables the ready/busy bar signal R/Bb for a first set time D1 (refer to FIG. 4). As a result, the control logic circuit 102 recognizes that an external control device, such as a memory controller (not shown), has received the ready/busy bar signal R/Bb and input data have been input to the plane 110 of the flash memory device 100. Furthermore, when the command signal CMD includes a confirmation code (for example, 10h), the control logic circuit 102 disables the ready/busy bar signal R/Bb for a second set time D2 (refer to FIG. 4), which is longer than the first set time D1. As a result, the control logic circuit 102 recognizes that the external control device has received the ready/busy bar signal R/Bb and the flash memory device 100 is in a program operation state. In addition, the control logic circuit 102 receives the external address signals ADD0 to ADDF and outputs a block address signal BLK_ADD, a plane address signal PLA_ADD, a column address signal COL_ADD, and a page address signal PAG_ADD (i.e., input address signals).

The main address counter 103 outputs an internal block address signal BADD1 and an internal plane address signal PLADD based on the block address signal BLK_ADD and the plane address signal PLA_ADD. The main address counter 103 also outputs an internal column address signal CLADD and an internal page address signal GADD based on the column address signal COL_ADD and the page address signal PAG_ADD.

The sub address counter 104 outputs an internal block address signal BADD2 based on the block address signal BLK_ADD and the plane address signal PLA_ADD.

The X-decoder 105 outputs block selection signals FBS1 to FBSK (K is an integer) in response to the internal block address signal BADD1. Furthermore, the X-decoder 105 decodes the internal page address signal GADD and outputs a row decoding signal RDEC to the high-voltage generator 107.

The X-decoder 106 outputs block selection signals SBS1 to SBSK in response to the internal block address signal BADD2.

The high-voltage generator 107 supplies a drain bias voltage VGD and a source bias voltage VGS to a global drain select line GDSL and a global source select line GSSL, respectively, in response to the program command PGM. The high-voltage generator 107 also supplies word line bias voltages VGW1 to VGWJ (J is an integer) to global word lines GWL1 to GWLJ, respectively, in response to the program command PGM. At this time, the high-voltage generator 107 generates one of the word line bias voltages VGW1 to VGWJ, which has a different voltage level from those of the remaining word line bias voltages, in response to the row decoding signal RDEC. For example, during the program operation of the flash memory device 100, the high-voltage generator 107 may generate one of the word line bias voltages VGW1 to VGWJ, which has a program voltage (for example, 18V) level, and the remaining word line bias voltages VGW1 to VGWJ having a program pass voltage (for example, 10V) level, in response to the row decoding signal RDEC.

The Y-decoder 108 is enabled or disabled in response to the internal plane address signal PLADD. The Y-decoder 108 is enabled to output column selection signals FCS1 to FCSR (R is an integer) in response to the internal column address signal CLADD.

The Y-decoder 109 is enabled or disabled in response to the internal plane address signal PLADD. The Y-decoder 109 is enabled to output column selection signals SCS1 to SCSR (R is an integer) in response to the internal column address signal CLADD. Preferably, when one of the Y-decoders 108, 109 is enabled, the other of the Y-decoders 108, 109 is disabled. Accordingly when one of the Y-decoders 108, 109 outputs the column selection signals FCS1 to FCSR or SCS1 to SCSR, the other of the Y-decoders 108, 109 stops the output operation of the column selection signals SCS1 to SCSR or FCS1 to FCSR.

The plane 110 includes memory blocks MF1 to MFK (K is an integer) and a page buffer unit 113. Preferably, the memory blocks MF1 to MFK are sequentially arranged in a row direction. The memory blocks MF1 to MFK are activated in response to the block selection signals FBS1 to FBSK, respectively. Preferably, when any one of the memory blocks MF1 to MFK is activated, the remaining memory blocks MF1 to MFK stay inactivated. During the program operation of the flash memory device 100, the page buffer unit 113 receives input data DI1 to DIU (U is an integer) from an external device (not shown) through the data I/O circuit 112 in response to the column selection signals FCS1 to FCSK and stores the received input data therein. Thereafter, the page buffer unit 113 outputs the input data DI1 to DIU to any one of the memory blocks MF1 to MFK, which has been activated. Furthermore, during the read operation of the flash memory device 100, the page buffer unit 113 receives read data DO1 to DOU (U is an integer) from any one of the memory blocks MF1 to MFK, which has been activated, and outputs the received read data to the data I/O circuit 112, in response to the column selection signals FCS1 to FCSK.

The plane 111 includes memory blocks MS1 to MSK (K is an integer) and a page buffer unit 114. Preferably, the memory blocks MS1 to MSK are sequentially arranged in a row direction. The memory blocks MS1 to MSK are activated in response to the block selection signals SBS1 to SBSK, respectively. Preferably, when any one of the memory blocks MS1 to MSK is activated, the remaining memory blocks MS1 to MSK stay inactivated. During the program operation of the flash memory device 100, the page buffer unit 114 receives the input data DI1 to DIU from the external device through the data I/O circuit 112 and stores the received input data therein, in response to the column selection signals SCS1 to SCSK. Thereafter, the page buffer unit 114 outputs the input data DI1 to DIU to any one of the memory blocks MS1 to MSK, which has been activated. Furthermore, during the read operation of the flash memory device 100, the page buffer unit 114 receives read data DO1 to DOT from any one of the memory blocks MS1 to MSK, which has been activated, and outputs the received read data to the data I/O circuit 112.

Figure 3:
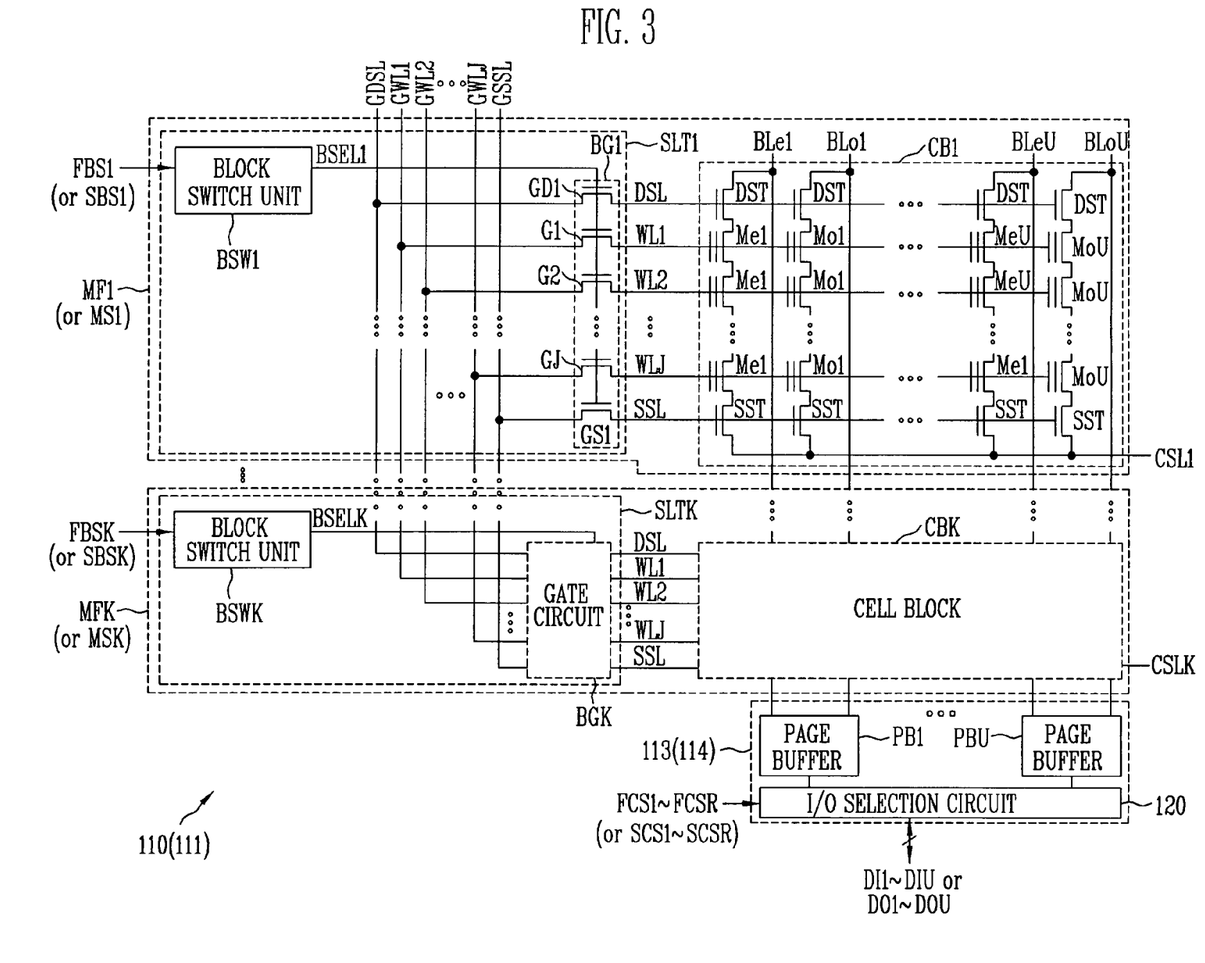
FIG. 3 is a detailed circuit diagram of the plane shown in FIG. 2.

FIG. 3 is a detailed circuit diagram of the plane shown in FIG. 2. FIG. 3 shows only the plane 110. The planes 110, 111 have substantially the same construction and operation and only the construction and operation of the plane 110 will be described in detail as an example. The plane 110 includes the memory blocks MF1 to MFK and the page buffer unit 113. Each of the memory blocks MF1 to MFK includes a cell block (one of CB1 to CBK) (K is an integer) and a block selection unit (one of SLT1 to SLTK). The memory blocks MF1 to MFK have substantially the same construction and operation and only the construction and operation of the memory block MF1 will be described below in detail as an example.

The memory block MF1 includes the cell block CB1 and the block selection unit SLT1. The cell block CB1 includes memory cells Me1 to MeU, Mo1 to MoU (U is an integer) connected to bit lines BLe1 to BLeU, BLo1 to BLoU (U is an integer) and local word lines WL1 to WLJ (J is an integer). In the cell block CB1, the memory cells Me1 to MeU, Mo1 to MoU connected to the same word line (for example, WL1) form one page. Furthermore, the cell block CB1 further includes a drain select transistors DST connected to a drain select line DSL and a source select transistors SST connected to a source select line SSL.

The block selection unit SLT1 includes a block switch unit BSW1 and a gate circuit BG1. The block switch unit BSW1 outputs a gate control signal BSEL1 in response to the block selection signal FBS1. The gate circuit BG1 connects the global drain select line GDSL, the global source select line GSSL, and the global word lines GWL1 to GWLJ to the local drain select lines DSL, the local source select lines SSL, and the local word lines WL1 to WLJ of the cell block CB1, respectively, in response to the gate control signal BSEL1.

The gate circuit BG1 includes NMOIS transistors GD1, G1 to GJ, GS1. The NMOIS transistor GD1 is connected between the global drain select line GDSL and the local drain select line DSL and is turned on or off in response to the gate control signal BSEL1. The NMOIS transistors G1 to GJ are connected between the global word lines GWL1 to GWLJ and the local word lines WL1 to WLJ, respectively, and are turned on or off in response to the gate control signal BSEL1. The NMOIS transistor GS1 is connected between the global source select line GSSL and the local source select line SSL and is turned on or off in response to the gate control signal BSEL1.

The page buffer unit 113 includes page buffers PB1 to PBU (U is an integer) and an I/O selection circuit 120. Each of the plurality of page buffers PB1 to PBU is connected to a pair of bit lines (a pair of BLe1, BLo1 to BLeU, BLoU). For example, the page buffer PB1 may be connected to the bit lines BLe1, BLo1. During the program operation of the flash memory device 100, the I/O selection circuit 120 selects a part or all of the page buffers PB1 to PBU in response to the column selection signals FCS1 to FCSR. The I/O selection circuit 120 outputs input data (a part or all of DI1 to DIU), which are received from the data I/O circuit 112 (refer to FIG. 2), to a part or all of the selected page buffers PB1 to PBU, respectively. As a result, the input data (a part or all of DI1 to DIU) are stored in the selected page buffers (a part or all of PB1 to PBU). Furthermore, during the read operation of the flash memory device 100, the I/O selection circuit 120 selects a part of the page buffers PB1 to PBU in response to the column selection signals FCS1 to FCSR. The I/O selection circuit 120 outputs the read data DO1 to DOU, which are received from selected page buffers (a part of PB1 to PBU), to the data I/O circuit 112.

Figure 4:
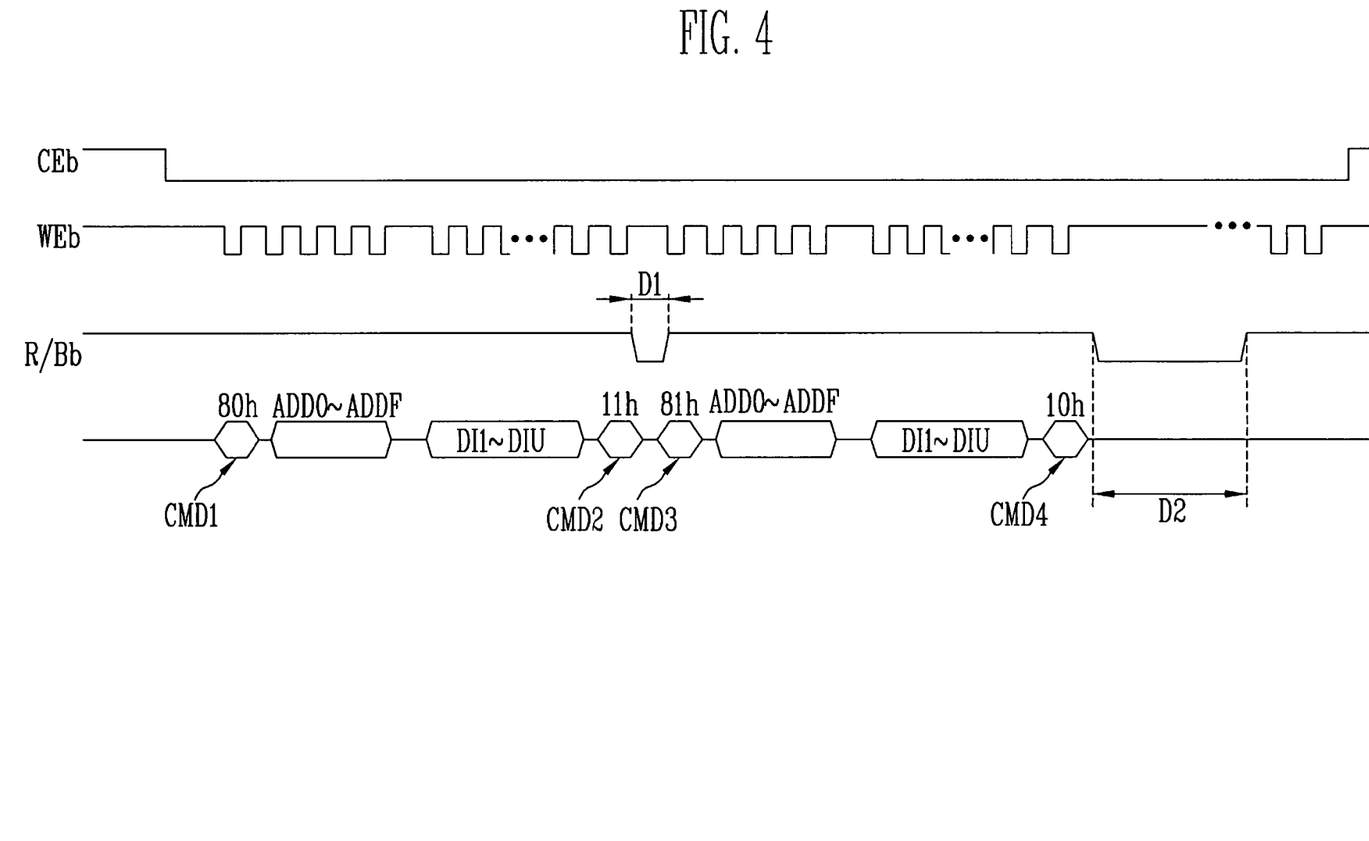
FIG. 4 is a timing diagram of signals related to the program operation of the dual-plane type flash memory device shown in FIG. 2.

The program operation process of the flash memory device 100 will be described in detail below with reference to FIG. 4. FIG. 4 is a timing diagram of signals related to the program operation of the dual-plane type flash memory device shown in FIG. 2.

The input buffer 101 receives a command signal CMD1 including a page program set-up code 80h from an external device and outputs it to the control logic circuit 102. The input buffer 101 also receives a part of external address signals ADD0 to ADDF from the external device and outputs them to the control logic circuit 102.

The control logic circuit 102 outputs the plane address signal PLA_ADD, the block address signal BLK_ADD, and the column address signal COL_ADD based on a part of the external address signals ADD0 to ADDF. At this time, the plane address signal PLA_ADD includes information corresponding to the plane 110. Accordingly, the main address counter 103 receives the plane address signal PLA_ADD, the block address signal BLK_ADD, and the column address signal COL_ADD. The main address counter 103 outputs the internal plane address signal PLADD and the internal column address signal CLADD based on the plane address signal PLA_ADD and the column address signal COL_ADD.

The Y-decoder 108 receives the internal column address signal CLADD in response to the internal plane address signal PLADD. The Y-decoder 108 outputs the column selection signals FCS1 to FCSR in response to the internal column address signal CLADD. At this time, since the internal plane address signal PLADD does not include information corresponding to the plane 111, the Y-decoder 109 does not operate. The page buffer unit 113 included in the plane 110 stores the input data DI1 to DIU received from the external device through the data I/O circuit 112 in response to the column selection signals FCS1 to FCSR.

While the input data DI1 to DIU are stored in the page buffer unit 113, any one of the memory blocks MF1 to MFK (for example, MF1) of the plane 110 is activated. In more detail, the main address counter 103 outputs the internal block address signal BADD1 based on the block address signal BLK_ADD. At this time, since the plane address signal PLA_ADD does not include information corresponding to the plane 111, the sub address counter 104 does not output the internal block address signal BADD2 although it receives the plane address signal PLA_ADD and the block address signal BLK_ADD.

The X-decoder 105 enables one (for example, FBS1) of the block selection signals FBS1 to FBSK and disables the remaining block selection signals FBS1 to FBSK, in response to the internal block address signal BADD1. The block switch unit BSW1 of the memory block MF1 enables the gate control signal BSEL1 in response to the block selection signal FBS1. The gate circuit BG1 of the memory block MF1 connects the global drain select line GDSL, the global source select line GSSL, and the global word lines GWL1 to GWLJ to the local drain select lines DSL, the local source select lines SSL, and the local word lines WL1 to WLJ of the cell block CB1 of the memory block MF1, respectively, in response to the gate control signal BSEL1. As a result, the memory block MF1 is activated. Meanwhile, the block selection units SLT2 to SLTK of the memory blocks MF2 to MFK separate the cell blocks CB2 to CBK from the global drain select line GDSL, the global source select line GSSL, and the global word lines GWL1 to GWLJ in response to the block selection signals FBS1 to FBSK.

Thereafter, the input buffer 101 receives a command signal CMD2 including a confirmation code (for example, 11h) and outputs it to the control logic circuit 101. The control logic circuit 102 disables the ready/busy bar signal R/Bb for the first set time D1 in response to the command signal CMD2. As a result, the control logic circuit 102 recognizes that the external device has received the ready/busy bar signal R/Bb and input data have been stored in the plane 110 of the flash memory device 100.

The input buffer 101 receives a command signal CMD3 including a page program set-up code 81h and outputs it to the control logic circuit 102. The control logic circuit 102 generates the program command PGM in response to the command signal CMD3. The input buffer 101 receives the external address signals ADD0 to ADDF and outputs them to the control logic circuit 102. The control logic circuit 102 outputs the block address signal BLK_ADD, the plane address signal PLA_ADD, the column address signal COL_ADD, and the page address signal PAG_ADD based on the external address signals ADD0 to ADDF. At this time, the plane address signal PLA_ADD includes information corresponding to the plane 111.

The main address counter 103 outputs the internal plane address signal PLADD and the internal column address signal CLADD based on the plane address signal PLA_ADD and the column address signal COL_ADD. The Y-decoder 109 receives the internal column address signal CLADD in response to the internal plane address signal PLADD. The Y-decoder 109 outputs the column selection signals SCS1 to SCSR in response to the internal column address signal CLADD. At this time, since the internal plane address signal PLADD does not include information corresponding to the plane 110, the Y-decoder 108 does not operate. The page buffer unit 114 included in the plane 111 stores the input data DI1 to DIU, which are received from the external device through the data I/O circuit 112, in response to the column selection signals SCS1 to SCSR.

While the input data DI1 to DIU are stored in the page buffer unit 114, any one (for example, MSK) of the memory blocks MS1 to MSK of the plane 111 is activated. In more detail, since the plane address signal PLA_ADD includes information corresponding to the plane 111, the sub address counter 104 receives the plane address signal PLA_ADD and the block address signal BLK_ADD. The sub address counter 104 outputs the internal block address signal BADD2 based on the block address signal BLK_ADD. At this time, since the plane address signal PLA_ADD does not include information corresponding to the plane 110, the main address counter 103 does not output the internal block address signal BADD1 although the plane address signal PLA_ADD and the block address signal BLK_ADD are received.

The X-decoder 106 enables one (for example, SBSK) of the block selection signals SBS1 to SBSK and disables the remaining block selection signals SBS1 to SBSK, in response to the internal block address signal BADD2. The block switch unit BSWK of the memory block MSK enables the gate control signal BSELK in response to the block selection signal SBSK. The gate circuit BG1 of the memory block MSK connects the global drain select line GDSL, the global source select line GSSL, and the global word lines GWL1 to GWLJ to the local drain select lines DSL, the local source select lines SSL, and the local word lines WL1 to WLJ of the cell block CBK of the memory block MSK, respectively, in response to the gate control signal BSELK. As a result, the memory block MSK is activated.

Meanwhile, the block selection units SLT1 to SLT(K-1) of the memory blocks MS1 to MS(K-1) separate the cell blocks CB1 to CB(K-1) from the global drain select line GDSL, the global source select line GSSL, and the global word lines GWL1 to GWLJ in response to the block selection signals SBS1 to FBS(K-1). Thereafter, the input buffer 101 receives a command signal CMD4 including a confirmation code (for example, 10h) and outputs it to the control logic circuit 101.

The control logic circuit 101 disables the ready/busy bar signal R/Bb during the second set time D2 in response to the command signal CMD4. As a result, the control logic circuit 101 the external device recognizes that the ready/busy bar signal R/Bb has been received and the flash memory device 100 is in a program operation.

Meanwhile, during the time D2, the drain bias voltage VGD and the source bias voltage VGS are supplied to the global drain select line GDSL and the global source select line GSSL, respectively, and the word line bias voltages VGW1 to VGWJ are supplied to the global word lines GWL1 to GWLJ, respectively. In more detail, the main address counter 103 outputs the internal page address signal GADD based on the page address signal PAG_ADD. The X-decoder 105 decodes the internal page address signal GADD and outputs the row decoding signal RDEC. The high-voltage generator 107 supplies the drain bias voltage VGD and the source bias voltage VGS to the global drain select line GDSL and the global source select line GSSL, respectively, in response to the program command PGM. The high-voltage generator 107 also supplies one (for example, VGW1) of the word line bias voltages VGW1 to VGWJ as a program voltage level and outputs the remaining word line bias voltages VGW1 to VGWJ as a program pass voltage level, in response to the program command PGM and the row decoding signal RDEC. As a result, a page having the memory cells Me1 to MeU or Mo1 to MoU connected to the global word line GWL1 of each of the activated memory blocks MF1, MSK is selected.

When the word line bias voltages VGW1 to VGWJ are supplied to the global word lines GWL1 to GWLJ, the page buffer units 113, 114 transmit the input data DI1 to DIU to the memory cells Me1 to MeU or Mo1 to MoU of each of the activated memory blocks MF1, MSK through the bit lines BLe1 to BLeU or BLo1 to BLoU. As a result, the input data DI1 to DIU are programmed into the memory cells Me1 to MeU or Mo1 to MoU of each of the activated memory blocks MF1, MSK.

As described above, during the program operation of the flash memory device 100, the main address counter 103 and the sub address counter 104 generate the internal block address signals BADD1, BADD2 respectively corresponding to the planes 113, 114. Accordingly, memory blocks of the planes 113, 114 having different block addresses can be programmed. As a result, the memory blocks MF1 to MFK, MS1 to MSK of the planes 113, 114 can be programmed randomly.

As described above, in accordance with a flash memory device and a program operation method thereof according to the present invention, during a program operation, memory blocks of two planes having different block addresses can be selected and programmed. Accordingly, the operational performance of the flash memory device can be enhanced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flash memory device comprising:
   a first plane having first memory blocks sequentially arranged in a row direction;
   a second plane having second memory blocks sequentially arranged in the row direction;
   a first X-decoder for activating one of the first memory blocks in response to a first block address signal; and a second X-decoder for activating one of the second memory blocks in response to a second block address signal, wherein, during a program operation, the block address of the first memory block activated by the first X-decoder is different from the block address of the second memory block activated by the second X-decoder.

2. The flash memory device of claim 1, further comprising:
a control logic circuit for receiving external address signals and outputting input address signals;
a main address counter for outputting the first block address signal based on one of the input address signals; and
a sub address counter for outputting the second block address signal based on the other of the input address signals.

3. The flash memory device of claim 2, further comprising an input buffer for receiving a command signal and the external address signals and outputting the command signal and the external address signals to the control logic circuit,
wherein the control logic circuit generates one of a program command, a read command, and an erase command in response to the command signal.

4. The flash memory device of claim 3, wherein the control logic circuit generates the program command when the command signal includes a page program set-up code, and disables a ready/busy bar signal for a set time when the command signal including a confirmation code is received after the program command is generated.

5. The flash memory device of claim 3, further comprising a high-voltage generator for supplying word line bias voltages to a plurality of global word lines in response to the program command or the read command.

6. The flash memory device of claim 1, wherein the first X-decoder outputs first block selection signals in response to the first block address signal, and the second X-decoder outputs second block selection signals in response to the second block address signal.

7. The flash memory device of claim 6, wherein each of the first memory blocks comprises:
a first cell block including a plurality of first memory cells; and
a first block selection unit for selecting the first cell block in response to one of the first block selection signals, and wherein
each of the second memory blocks comprises
a second cell block including a plurality of second memory cells; and
a second block selection unit for selecting the second cell block in response to one of the second block selection signals.

8. The flash memory device of claim 7, wherein the first memory cells are connected to first bit lines and the second memory cells are connected to second bit lines, and
the first plane further comprises a first page buffer unit connected to the first bit lines, for receiving externally input data from an external device through a data I/O circuit or receiving first read data from a part of the first memory cells through a part of the first bit lines, in response to a first column selection signal, and
the second plane further comprises a second page buffer unit connected to the second bit lines, for receiving the externally input data from the external device through the data I/O circuit or receiving second read data from a part of the second memory cells through a part of the second bit lines, in response to a second column selection signal.

9. The flash memory device of claim 5, wherein each of the first memory blocks comprises:
a first cell block including a plurality of first memory cells; and
a first block selection unit for selecting the first cell block in response to one of first block selection signals, and
each of the second memory blocks
a second cell block including a plurality of second memory cells; and
a second block selection unit for selecting the second cell block in response to one of the second block selection signals.

10. The flash memory device of claim 9, wherein the first block selection unit and the second block selection unit share the plurality of global word lines,
the first block selection unit selects the first cell block by connecting first local word lines, which are connected to the plurality of first memory cells, to the plurality of global word lines, respectively, and
the second block selection unit selects the second cell block by connecting second local word lines, which are connected to the plurality of second memory cells, to the plurality of global word lines, respectively.

11. The flash memory device of claim 2, wherein
the input address signals includes a block address signal, a plane address signal, a column address signal, and a page address signal;
the main address counter outputs the first block address signal based on the block address signal and outputs an internal plane address signal and an internal column address signal based on the plane address signal and the column address signal; and
the sub address counter outputs the second block address signal based on the block address signal.

12. The flash memory device of claim 11, further comprising:
a first Y-decoder for outputting first column selection signals in response to the internal plane address signal and the internal column address signal; and
a second Y-decoder for outputting second column selection signals in response to the internal plane address signal and the internal column address signal,
wherein when one of the first and second Y-decoders outputs the first or second column selection signal, the other of the first and second Y-decoders stops an output operation of the second or first column selection signal.

13. The flash memory device of claim 12, wherein the first X-decoder outputs first block selection signals in response to the first block address signal, and the second X-decoder outputs second block selection signals in response to the second block address signal;
each of the first memory blocks comprises:
a first cell block including a plurality of first memory cells connected to first bit lines; and
a first block selection unit for selecting the first cell block in response to one of the first block selection signals, and
each of the second memory blocks comprises:
a second cell block including a plurality of second memory cells connected to second bit lines; and
a second block selection unit for selecting the second cell block in response to one of the second block selection signals.

14. The flash memory device of claim 13, wherein the first plane further comprises a first page buffer unit connected to the first bit lines, for receiving externally input data through a data I/O circuit or receiving first read data from a part of the first memory cells through a part of the first bit lines, in response to a first column selection signals, and the second plane further comprises a second page buffer unit connected to the second bit lines, for receiving the externally input data through the data I/O circuit or receiving second read data from a part of the second memory cells through a part of the second bit lines, in response to a second column selection signal.

15. The flash memory device of claim 5, wherein the input address signals include a block address signal, a plane address signal, a column address signal, and a page address signal, the main address counter outputs an internal page address signal based on the page address signal, one of the first and second X-decoders decodes the internal page address signal and outputs a row decoding signal, and the high-voltage generator supplies a program voltage to any one of the plurality of global word lines and supplies a program pass voltage to the remaining global word lines, in response to the program command and the row decoding signal.

16. A program operation method of a flash memory device, comprising the steps of:

storing first input data in a first page buffer unit included in a first plane;

activating one of a plurality of first memory blocks included in the first plane, said plurality of first memory blocks sequentially arranged in a row direction;

storing second input data in a second page buffer unit included in a second plane;

activating one of a plurality of second memory blocks included in the second plane, said plurality of second memory blocks and sequentially arranged in a row direction; and when one of the first memory blocks and one of the second memory blocks are activated, transmitting the first and second input data included in the first and second page buffer units to the activated first and second memory blocks, wherein the block address of the activated first memory block is different from that of the activated second memory block.

17. The program operation method of claim 16, further comprising:

outputting first input address signals including a first block address signal, a first plane address signal, and a first column address signal based on a part of external address signals before the step of storing the first input data; and outputting second input address signals including a second block address signal, a second plane address signal, a second column address signal, and a page address signal based on the external address signals before the step of storing the second input data.

18. The program operation method of claim 17, wherein the step of storing the first input data in the first page buffer unit comprises the steps of:

outputting an internal plane address signal and an internal column address signal based on the first plane address signal and the first column address signal;

outputting first column selection signals in response to the internal plane address signal and the internal column address signal; and storing the first input data, which are received from an external device, in the first page buffer unit in response to the column selection signals.

19. The program operation method of claim 17, wherein the step of storing the second input data in the second page buffer unit comprises the steps of:

outputting an internal plane address signal and an internal column address signal based on the second plane address signal and the second column address signal;

outputting column selection signals in response to the internal plane address signal and the internal column address signal; and storing the second input data, which are received from an external device, in the second page buffer unit in response to the column selection signals.

20. The program operation method of claim 17, further comprising the steps of, before the step of storing the second input data in the second page buffer unit, generating a program command in response to a command signal;

decoding the page address signal and generating a row decoding signal; and when the transmission step is executed, supplying a word line bias voltage of a program voltage level to one of the global word lines, a word line bias voltage of a program pass voltage level to the remaining global word lines, and a drain bias voltage and a source bias voltage to a global drain select line and a global source select line, respectively, in response to the program command and the row decoding signal.

21. The program operation method of claim 20, wherein the step of activating one of the first memory blocks comprises the steps of:

generating an internal block address signal based on the first plane address signal and the first block address signal;

generating block selection signals in response to the internal block address signal; and connecting a local drain select line, a local source select line, and local word lines of one of the first memory blocks to the global drain select line, the global source select line, and the global word lines, respectively, in response to the block selection signals.

22. The program operation method of claim 20, wherein the step of activating one of the second memory blocks comprises the steps of:

generating an internal block address signal based on the second plane address signal and the second block address signal;

generating block selection signals in response to the internal block address signal; and connecting a local drain select line, a local source select line, and local word lines of one of the second memory blocks to the global drain select line, the global source select line, and the global word lines, respectively, in response to the block selection signals.

* * * * *